United States Patent [19]
Matumoto

[11] Patent Number: 5,972,774
[45] Date of Patent: *Oct. 26, 1999

[54] PROCESS FOR FABRICATING A SEMICONDUCTOR DEVICE HAVING CONTACT HOLE OPEN TO IMPURITY REGION COPLANAR WITH BURIED ISOLATING REGION

[75] Inventor: Akira Matumoto, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/787,236

[22] Filed: Jan. 22, 1997

Related U.S. Application Data

[62] Division of application No. 08/604,129, Feb. 20, 1996, Pat. No. 5,804,862.

[30] Foreign Application Priority Data

Feb. 21, 1995 [JP] Japan ................................. 7-32226

[51] Int. Cl.$^6$ ................................................. H01L 21/28
[52] U.S. Cl. ..................... 438/435; 438/353; 438/637; 438/645; 438/648; 438/655
[58] Field of Search ................................. 437/67, 73, 190, 437/192, 200, 415 M; 438/424, 430, 434, 435, 437, 453, 597, 637, 648, 649, 627, 629, 630, 645, 655

[56] References Cited

U.S. PATENT DOCUMENTS

| | | | |
|---|---|---|---|
| 4,505,333 | 3/1985 | Kurosawa | 438/424 |
| 4,973,562 | 11/1990 | Den Blanken | 437/189 |
| 5,112,765 | 5/1992 | Cederbaum et al. | 637/41 |
| 5,162,262 | 11/1992 | Ajika et al. | 437/200 |
| 5,244,827 | 9/1993 | Dixit et al. | 437/70 |
| 5,244,837 | 9/1993 | Dennison | 437/195 |
| 5,268,329 | 12/1993 | Chittipeddhi et al. | 438/627 |
| 5,268,330 | 12/1993 | Givens et al. | 437/195 |
| 5,316,977 | 5/1994 | Kunishima et al. | 437/200 |
| 5,604,159 | 2/1997 | Cooper et al. | 437/203 |

FOREIGN PATENT DOCUMENTS

| | | |
|---|---|---|
| 59-204236 | 11/1984 | Japan . |
| 62-190847 | 8/1987 | Japan . |
| 3-285344 | 12/1991 | Japan . |
| 3-286527 | 12/1991 | Japan . |
| 4-72729 | 3/1992 | Japan . |
| 5-198526 | 8/1993 | Japan . |
| 6-13470 | 1/1994 | Japan . |
| 7-14918 | 1/1995 | Japan . |

*Primary Examiner*—T. N. Quach
*Attorney, Agent, or Firm*—Hayes, Soloway, Hennessey, Grossman & Hage PC

[57] ABSTRACT

A MIS type field effect transistor has a source/drain region overlain by a titanium silicide layer contiguous to an upper silicon nitride layer of a buried isolating structure embedded into a silicon substrate, and a contact hole is formed in an inter-level insulating layer of silicon oxide exposing a part of the upper silicon nitride layer and a part of the titanium silicide layer into the contact hole; while the inter-level insulating layer is being selectively etched so as to form the contact hole, the upper silicon nitride layer serves as an etching stopper, and the contact hole never reaches the silicon substrate beneath the buried isolating structure.

9 Claims, 8 Drawing Sheets

5,972,774

PROCESS FOR FABRICATING A SEMICONDUCTOR DEVICE HAVING CONTACT HOLE OPEN TO IMPURITY REGION COPLANAR WITH BURIED ISOLATING REGION

This is a divisional of application Ser. No. 08/604,129 filed on Feb. 20, 1996, U.S. Pat. No. 5,804,862.

FIELD OF THE INVENTION

This invention relates to a semiconductor device and a process of fabrication thereof and, more particularly, to a semiconductor integrated circuit device having a contact hole open to an impurity region coplanar with a buried isolating region and a process of fabrication thereof.

DESCRIPTION OF THE RELATED ART

A semiconductor integrated circuit device has circuit components fabricated on a semiconductor substrate, and wirings extends over an inter-level insulating layer laminated on the semiconductor substrate. Contact holes are formed in the inter-level insulating layer, and the wirings provide signal paths through the contact holes between the circuit components.

Manufacturers have progressively increased the integration density of the semiconductor integrated circuit device and, accordingly, miniaturized the circuit components. A MOS (Metal-Oxide-Semiconductor) type field effect transistor is a typical circuit component of the semiconductor integrated circuit device, and extremely small MOS type field effect transistors are integrated on a semiconductor substrate. The source and drain regions become shallow, and refractory metal silicide layers are laminated on the source and drain regions so as to keep the resistance low.

FIGS. 1A to 1D illustrate a prior art process sequence for forming a contact hole open to a refractory metal silicide layer laminated on an impurity region. The prior art process proceeds as follows.

A p-type silicon substrate 1 is selectively oxidized by using the LOCOS (Local Oxidation of Silicon) technology, and a thick field oxide layer 2 of silicon oxide is grown on the major surface of the p-type silicon substrate 1. The thick field oxide layer 2 projects from the major surface of the p-type silicon substrate 1, and defines active areas assigned to circuit components such as MOS type field effect transistors.

Though not shown, thin gate oxide films are grown on the active areas, and polysilicon gate electrodes are patterned on the thin gate oxide films. Side wall spacers (not shown) are formed of silicon oxide, and are provided on the side surfaces of the gate electrodes. The gate oxide layer, the polysilicon gate electrode and the side wall spacers form in combination a gate structure.

N-type dopant impurity is ion implanted into the polysilicon gate electrodes and the active areas, and n-type source/drain regions 1a and 1b are formed in the active areas in a self-aligned manner with the gate structure through a heat treatment.

Titanium target is sputtered, and titanium is deposited over the entire surface of the resultant structure. The titanium layer 3 is treated with heat, and the titanium reacts with silicon and polysilicon. As a result, the titanium layer 3 is partially converted to titanium silicide portions 3a and 3b. However, the titanium does not react with silicon oxide, and titanium portions 3c remain on the side spacers and the thick field oxide layer 2 as shown in FIG. 1A.

The residual titanium 3c is etched away by using etching solution containing ammonia and hydrogen peroxide. The titanium silicide is left on the n-type source and drain regions 1a and 1b and the polysilicon gate electrode (not shown), and the n-type source and drain regions 1a/1b are overlain by the titanium silicide layers 3a and 3b.

Insulating substance such as silicon oxide and borophosphosilicate glass are deposited over the entire surface of the structure, and forms an inter-level insulating layer 4 as shown in FIG. 1B.

Subsequently, a photo-resist mask 5 is formed on the inter-level insulating layer 4 by using lithographic techniques, and the photo-resist mask 5 has an opening 5a equivalent to a contact hole to be formed as shown in FIG. 1C. Although the lithographic techniques tries to form the photo-resist mask 5 at an appropriate position 5b where the opening 5a is properly nested in the n-type source region 1a, the photo-resist mask 5 is deviated from the appropriate position 5b, and the opening 5a is located partially over the n-type source region 1a and partially over the thick field oxide layer 2.

Using the photo-resist mask 5, the inter-level insulating layer is selectively etched away, and a contact hole 4a is formed in the inter-level insulating layer 4. The titanium silicide layer 3a protects the n-type source region 1a against the etchant. However, the etchant partially removes the thick field oxide layer 2, and the contact hole 4a reaches the p-type silicon substrate 1 beneath the thick field oxide layer 2 as shown in FIG. 1D.

When the contact hole 4a is plugged with a tungsten piece (not shown), the tungsten plug is held in contact with both of the titanium silicide layer 3a and the p-type silicon substrate 1, and short-circuits a wiring strip (not shown) with the p-type silicon substrate 1.

In order to prevent the undesirable short-circuit, an appropriate nesting tolerance is required. When the contact hole 4a is 0.5 micron in diameter, the manufacturer takes the nesting tolerance into account, and designs the n-type source region 1a to be at least 1.0 micron in width.

However, such a wide impurity region is causative of large parasitic capacitance, and deteriorates the signal propagation characteristics.

Japanese Patent Publication of Unexamined Application No. 61-224414 discloses a contact structure effective against the misregistration. FIGS. 2A and 2B illustrate the second prior art process disclosed in the Japanese Patent Publication of Unexamined Application.

The second prior art process is analogous to the first prior art process until the deposition of a titanium layer 10. The titanium layer 10 is laminated on a thick field oxide layer 11 and n-type impurity regions 12a/12b formed in a p-type silicon substrate 12 on both sides of the thick field oxide layer 11.

The titanium layer 10 is 50 nanometers thick, and is subjected to a heat treatment at 700 degrees in centigrade for tens seconds. The titanium reacts with the silicon, and is converted to titanium silicide. While the heat is being applied, the titanium silicide regions 10a and 10b sidewardly extends at least 1 micron, and the thick field oxide layer 11 is partially overlain by the titanium silicide regions 10a and 10b. The titanium portion 10c is only left on the central area of the thick field oxide layer 11 as shown in FIG. 2A.

The residual titanium 10c is etched away by using the etchant containing ammonia and hydrogen peroxide, and the titanium silicide layers 10a and 10b are left on the n-type impurity regions 10a/10b and the peripheral areas of the thick field oxide layer 11. The resultant structure is covered with an inter-level insulating layer 13, and a photo-resist mask 14 is provided on the inter-level insulating layer 13. Using the photo-resist mask 14, the inter-level insulating layer 13 is selectively etched away, and a contact hole 13a is formed in the inter-level insulating layer 13 as shown in FIG. 2B.

If the photo-resist mask 14 is deviated from an appropriate position 14a, the contact hole 13a is not properly nested in the n-type impurity region 12a. However, the titanium silicide layer 10a does not allow the etchant to erode the thick field oxide layer 11, and undesirable short-circuit does not take place.

Thus, the wide titanium silicide layer 10a takes up the misregistration, and the manufacturer does not need to widen the n-type impurity region 12a. The narrow n-type impurity region 12a decreases the parasitic capacitance, and improves the signal propagation characteristics of the semiconductor integrated circuit device.

However, the second prior art process is hardly applied to a miniture contact hole incorporated in a semiconductor integrated circuit device of the next generation. In detail, Japanese Patent Publication of Unexamined Application No. 61-224414 discloses a graph illustrating the relation of the extended length of the titanium silicide and the time for the heat treatment, and FIG. 3 shows the graph. The graph teaches us that the titanium silicide rapidly extends. When the contact hole and the impurity region is of the order of 1 micron in diameter and 2–3 microns in width, the second prior art process is available. However, if the contact hole is further miniaturized, the titanium silicide tends to bridge the thick field oxide between impurity regions on both sides thereof.

SUMMARY OF THE INVENTION

It is therefore an important object of the present invention to provide a semiconductor device which is free from a short circuit due to a misregistration between an impurity region and a contact hole.

It is also an important object of the present invention to provide a process of fabricating the semiconductor device without undesirable short-circuit.

To accomplish the object, the present invention proposes to use a buried isolating structure as an etching stopper.

In accordance with one aspect of the present invention, there is provided a semiconductor device comprising: a conductive region providing a contact surface thereover; an isolating region adjacent to the conductive region and having an upper surface coplanar with the contact surface; and a contact structure electrically connected to the conductive region, and located over a part of the conductive region and a part of the isolating region.

In accordance with another aspect of the present invention, there is provided a semiconductor integrated circuit device fabricated on a semiconductor substrate, comprising: a buried isolating structure embedded into a surface portion of the semiconductor substrate, and having an upper layer formed of a first insulator, the buried isolating structure defining at least one active area in the semiconductor substrate; at least one circuit component including a conductive region formed in the at least one active area and contiguous to the upper layer of the buried isolating structure; an inter-level insulating layer formed of a second insulating substance extending on the semiconductor substrate, and exposing a part of the conductive region and a part of the upper layer of the buried isolating structure to a contact hole formed therein; a contact structure formed in the contact hole, and held in contact with the part of the conductive region and the part of the upper layer of the buried isolating structure; and a wiring strip extending on the inter-level insulating layer, and electrically connected through the contact structure to the conductive region.

In accordance with yet another aspect of the present invention, there is provided a process of fabricating a semiconductor device, comprising the steps of: making a conductive region and an isolating region substantially coplanar with one another; and forming a contact structure held in contact with a part of the conductive region and a part of the isolating region.

In accordance with still another aspect of the present invention, there is provided a process of fabricating a semiconductor device, comprising the steps of: a) preparing a semiconductor substrate; b) forming a buried isolating structure embedded into a surface portion of the semiconductor substrate, and having an upper layer formed of a first insulator; c) forming at least one circuit component including a conductive region formed on another surface portion of the semiconductor substrate and contiguous to the upper layer of the buried isolating structure; d) covering the upper layer of the buried isolating structure and the at least one circuit component with an inter-level insulating layer formed of a second insulator different from the first insulator; e) selectively etching the inter-level insulating layer by using an etchant selective between the first insulator and the second insulator so as to form a contact hole, a part of the conductive region and a part of the upper layer of the buried isolating structure being exposed to the contact hole; f) forming a contact structure in the contact hole so as to be held in contact with the part of the conductive region and the part of the upper layer of the buried isolating structure; and g) forming a wiring strip electrically connected through the contact structure to the conductive region.

BRIEF DESCRIPTION OF THE DRAWINGS

The features and advantages of the semiconductor device and the process of fabrication thereof according to the present invention will be more clearly understood from the following description taken in conjunction with the accompanying drawings in which.

DESCRIPTION OF THE PREFERRED EMBODIMENT

FIGS. 4A to 4F illustrate a process of fabricating a MIS (Metal-Insulator-Semiconductor) type field effect transistor embodying the present invention. The MIS type field effect transistor forms an integrated circuit together with other circuit components.

The process sequence starts with preparation of a lightly doped p-type silicon substrate 20, and a photo-resist mask (not shown) is provided on the major surface of the p-type silicon substrate 20 by using lithographic techniques. The photo-resist mask exposes an area of the major surface assigned to an isolating region. The exposed area is anisotropically etched away, and a moat 21 is formed in the exposed area. The moat 21 is 300 nanometers in depth.

The photo-resist mask is stripped off, and silicon oxide is deposited to 400 nanometers thick on the entire surface of the p-type silicon substrate 20 by using a chemical vapor deposition. The silicon oxide fills the moat 21, and swells out. The silicon oxide layer is uniformly etched away by 200 nanometers thick without a mask. As a result, a silicon oxide layer 22 is left in the moat 21, and the upper surface of the silicon oxide layer 22 is 100 nanometers in depth from the major surface of the p-type silicon substrate 20. The major surface of the p-type silicon substrate 20 is exposed again.

Figure 1A:
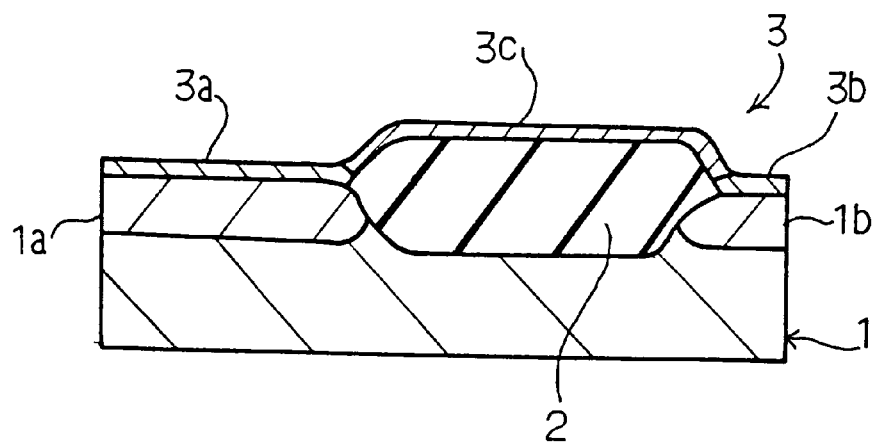
FIGS. 1A to 1D are cross sectional views showing the first prior art process sequence for fabricating a semiconductor integrated circuit device.
Figure 1B:
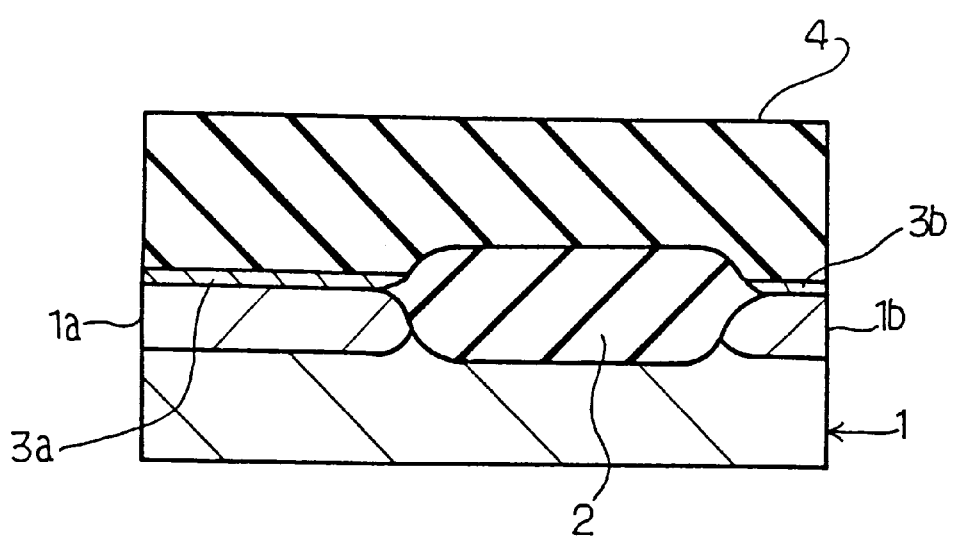
Figure 1C:
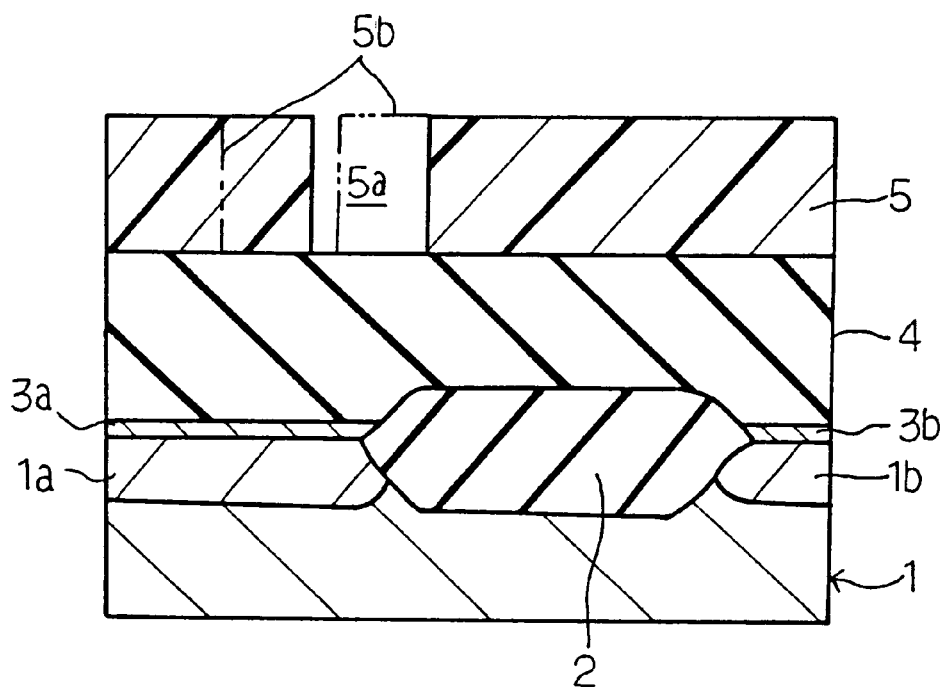
Figure 1D:
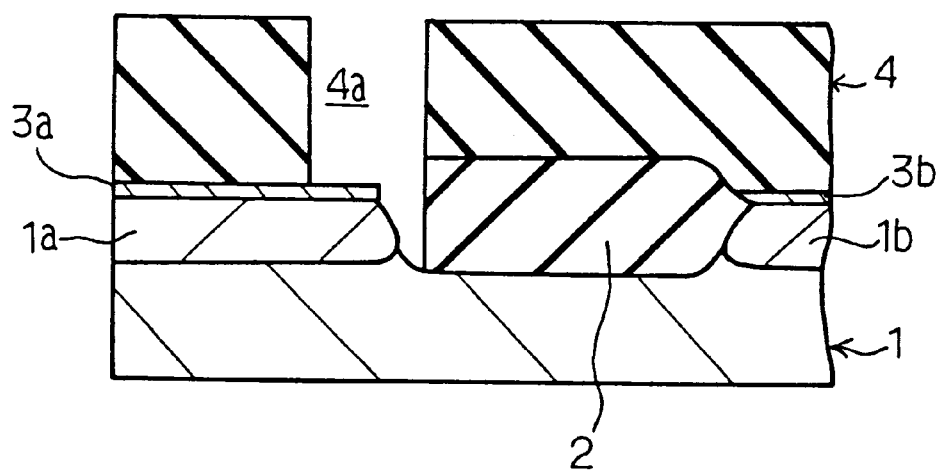
Figure 2A:
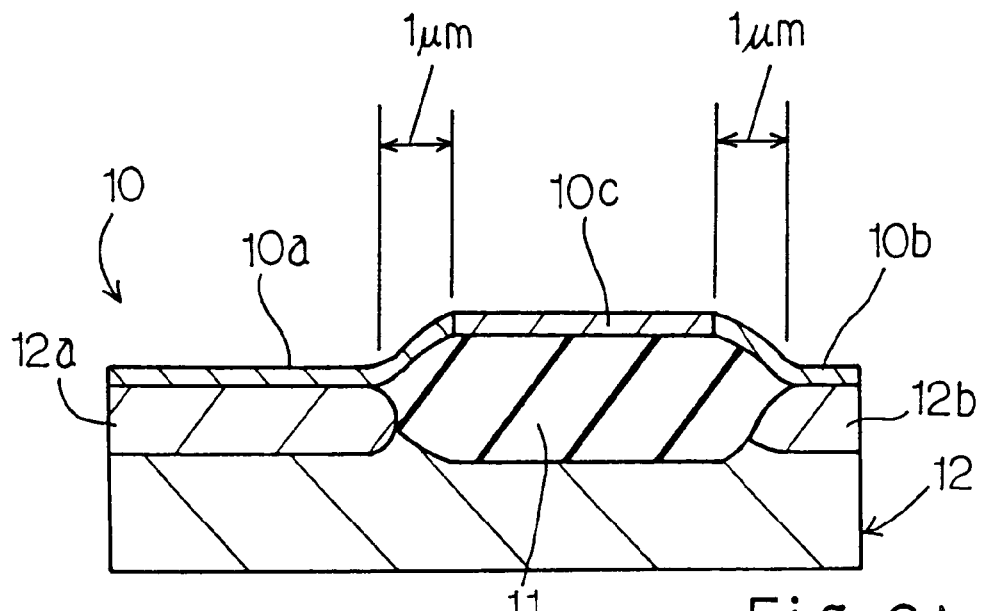
FIGS. 2A and 2B are cross sectional views showing the second prior art process sequence for fabricating a semiconductor integrated circuit device.
Figure 2B:
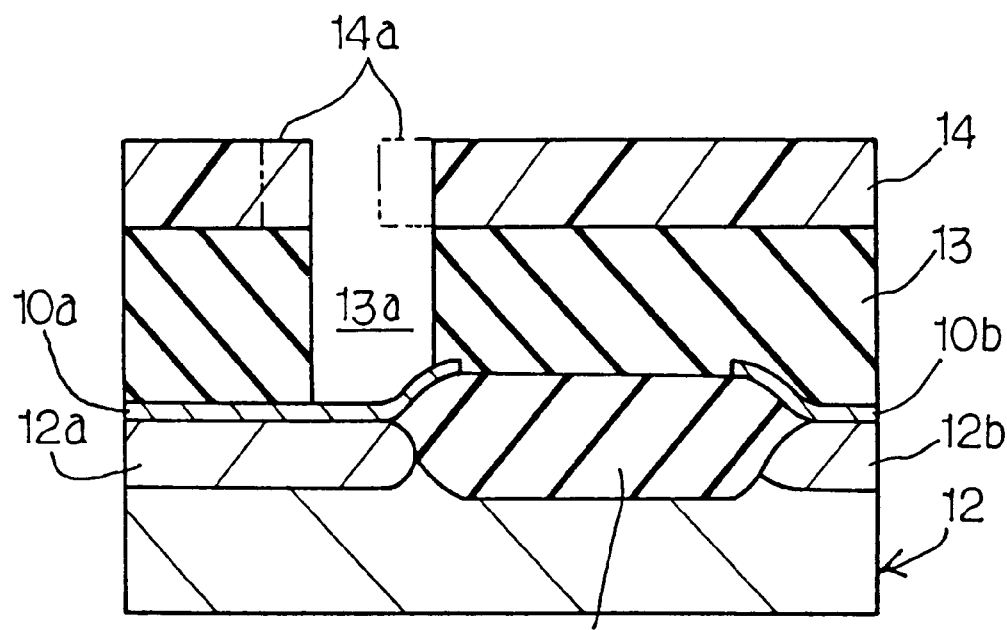
Figure 3:
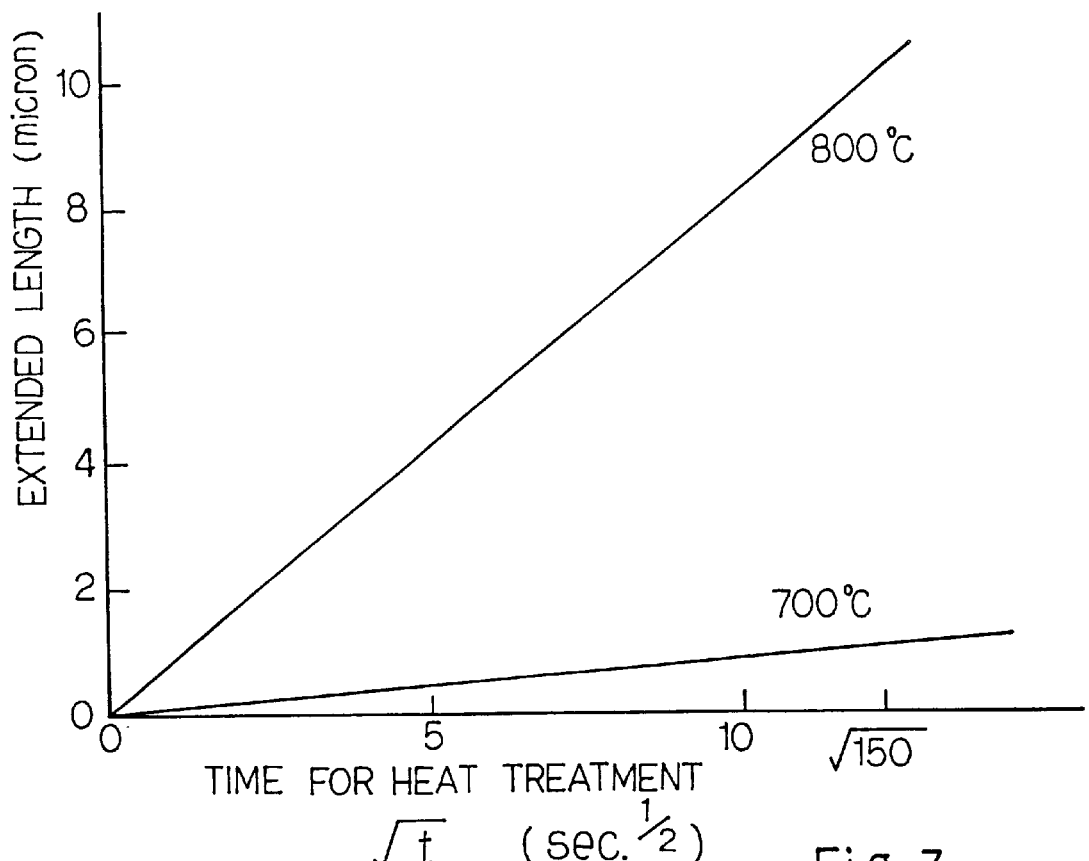
FIG. 3 is a graph showing the extended length of the titanium silicide in terms of the time disclosed in Japanese Patent Publication of Unexamined Application No. 61-224414.
Figure 4A:
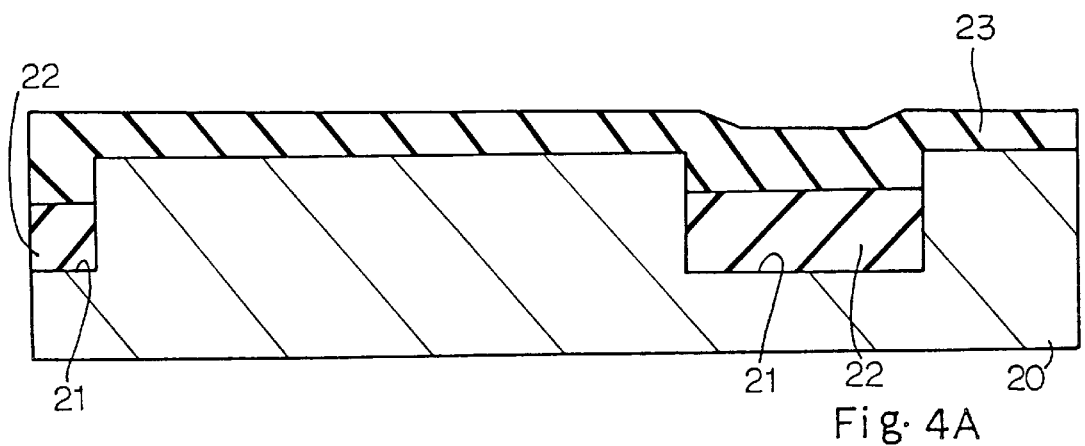
FIGS. 4A to 4F are cross sectional views showing a process sequence for fabricating a semiconductor device according to the present invention.

Subsequently, silicon nitride is deposited to 300 nanometers thick by using a chemical vapor deposition, and the silicon oxide layer 22 and the major surface of the p-type silicon substrate 20 are covered with a silicon nitride layer 23 as shown in FIG. 4A.

The silicon nitride layer 23 is uniformly removed by using a chemical-mechanical polishing technique until the major surface of the p-type silicon substrate 20 is exposed again. As a result, a buried isolating structure 24 is formed in the moat 22, and has a smooth upper surface 24a substantially coplanar with the major surface of the p-type silicon substrate 20. The buried isolating structure 24 defines active areas assigned to circuit components. One of the active areas is assigned to an n-channel MIS (Metal-Insulator-Semiconductor) type field effect transistor 25. Although the n-channel MIS type transistor 25 is fabricated on the active area together with other MIS type field effect transistors, description is focused on the n-channel MIS type field effect transistor 25 for the sake of simplicity.

The active areas are thermally oxidized, and are covered with thin silicon oxide layers, respectively. Polysilicon is deposited over the entire surface of the structure, i.e., the thin silicon oxide layers and the buried isolating structure 24 by using a chemical vapor deposition. An appropriate photo-resist mask is provided on the polysilicon layer, and the polysilicon layer is selectively etched away so as to form a gate electrode 25a.

Silicon oxide is deposited on the entire surface of the resultant structure, and the silicon oxide layer and the thin silicon oxide layer are anisotropically etched, thereby forming side wall spacers 25b on the side surfaces of the gate electrode 25a and a thin gate insulating layer 25c beneath the gate electrode 25a.

Figure 4B:
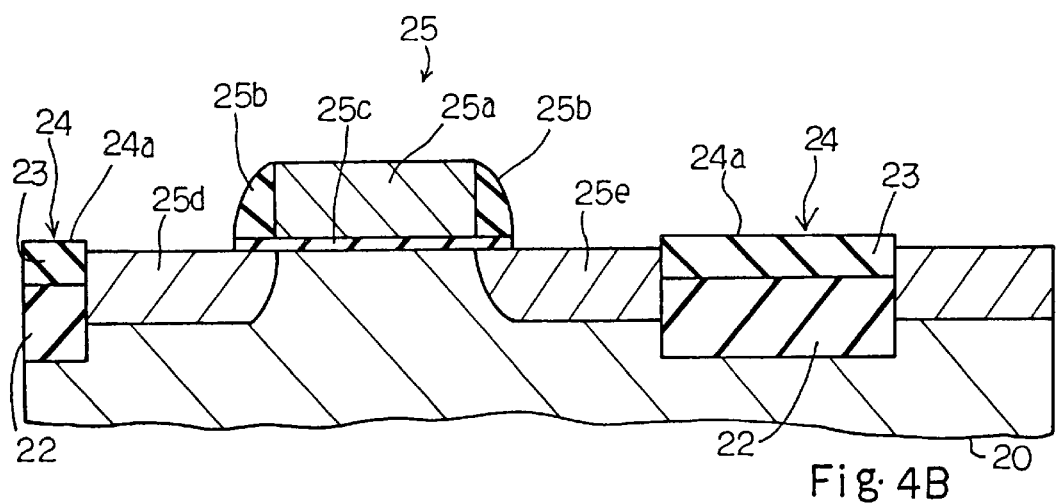

N-type dopant impurity such as, for example, arsenic is ion implanted into the gate electrode 25a and the active area, and heavily doped n-type impurity regions are formed in the active area in a self-aligned manner with the side wall spacers 25b. The ion-implanted arsenic is activated through a heat treatment, and heavily doped n-type source/drain regions 25d and 25e are formed from the heavily doped n-type impurity regions as shown in FIG. 4B.

Figure 4C:
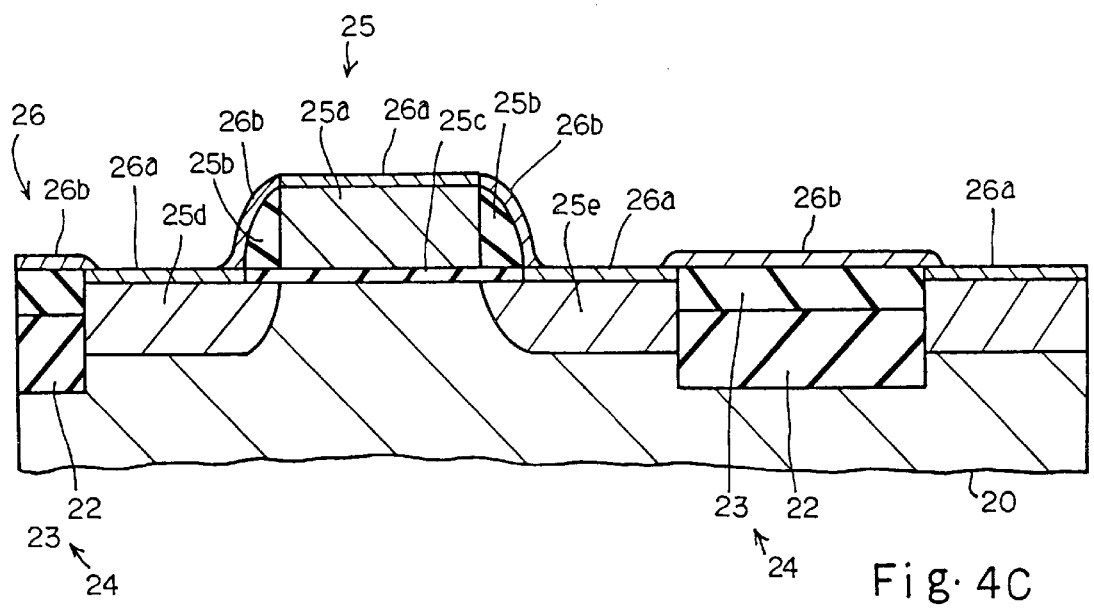

Subsequently, a titanium target (not shown) is sputtered, and a titanium layer 26 is deposited to 40 nanometers thick over the entire surface of the resultant structure. The titanium layer 26 is heated to 650 degrees in centigrade for 30 seconds. Then, the titanium reacts with the silicon/polysilicon, and the titanium layer 26 is selectively converted to titanium silicide regions 26a. However, the titanium does not react with the silicon oxide and silicon nitride, and titanium regions 26b are left on the side wall spacers 25b and the buried isolating structure 24 as shown in FIG. 4C.

Figure 4D:
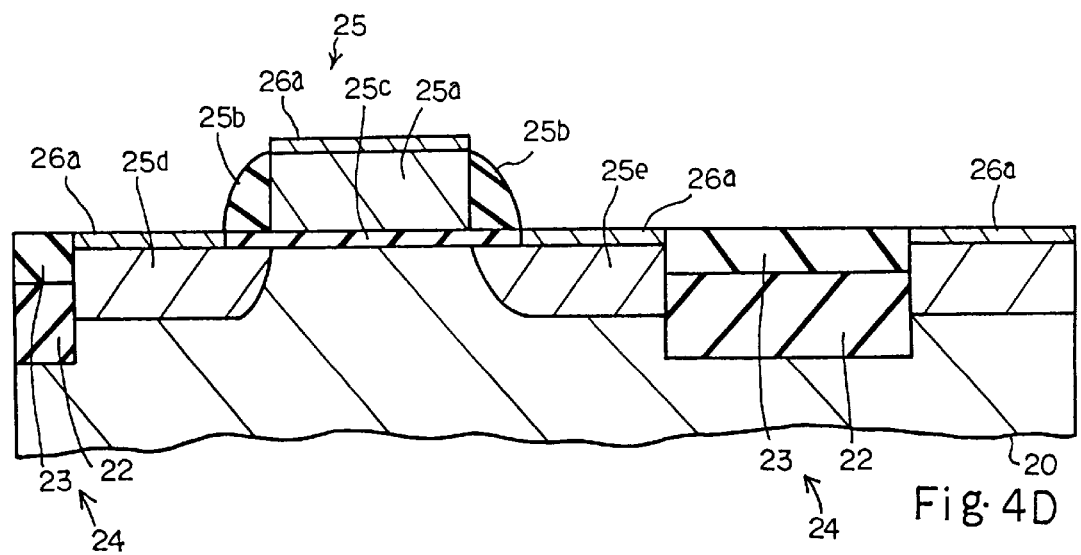

The titanium regions 26b are etched away by using the etchant containing ammonia and hydrogen peroxide, and only the titanium silicide regions 26a are left on the heavily doped n-type source/drain regions 25d/25e and the polysilicon gate electrode 25a as shown in FIG. 4D.

In this instance, the n-type source/drain region 25e and the titanium silicide layer 26a formed thereon form in combination a conductive region.

Subsequently, silicon oxide is deposited to 100 nanometers thick by using the chemical vapor deposition over the entire surface of the resultant structure, and the silicon oxide layer is covered with a boro-phosphosilicate glass layer of 900 nanometers thick. The boro-phosphosilicate glass layer is reflowed at 800 degrees in centigrade for 30 seconds. The silicon oxide layer and the boro-phosphosilicate glass layer form in combination an inter-level insulating layer 27.

An appropriate photo-resist mask (not shown) is provided on the inter-level insulating layer 27, and has an opening corresponding to a contact hole to be formed in the inter-level insulating layer 27. In this instance, the contact hole to be formed is 0.5 micron in diameter, and the opening is located in such a manner that the titanium silicide region 26a on the heavily doped n-type source/drain region 25e is exposed to the contact hole to be formed by 0.15 micron wide.

Using the photo-resist mask, the inter-level insulating layer 27 is anisotropically etched so as to form the contact hole 27a in the inter-level insulating layer 27. The silicon nitride layer 23 serves as an etching stopper, and the contact hole 27a does not reach the p-type silicon substrate 20. In other words, the titanium silicide layer 26a and the silicon nitride layer 23 terminate the anisotropical etching at the upper surfaces thereof.

Titanium silicide is deposited to 30 nanometers thick on the entire surface of the structure by using a sputtering technique. A titanium silicide layer 28 topographically extends on the exposed surface of the structure, and the inner surface defining the contact hole 27a is covered with the titanium silicide layer 28. The titanium silicide layer 28 is held in contact with the titanium silicide region 26a and the silicon nitride layer 23 of the buried isolating structure 24 exposed to the contact hole 27a. Titanium nitride is further deposited to 50 nanometers thick over the titanium silicide layer 28 by using a sputtering technique, and the titanium nitride layer 29 serves as a barrier metal layer. The titanium nitride layer 29 topographically extends, and defines a recess 28a inside of the contact hole 27a.

Figure 4E:
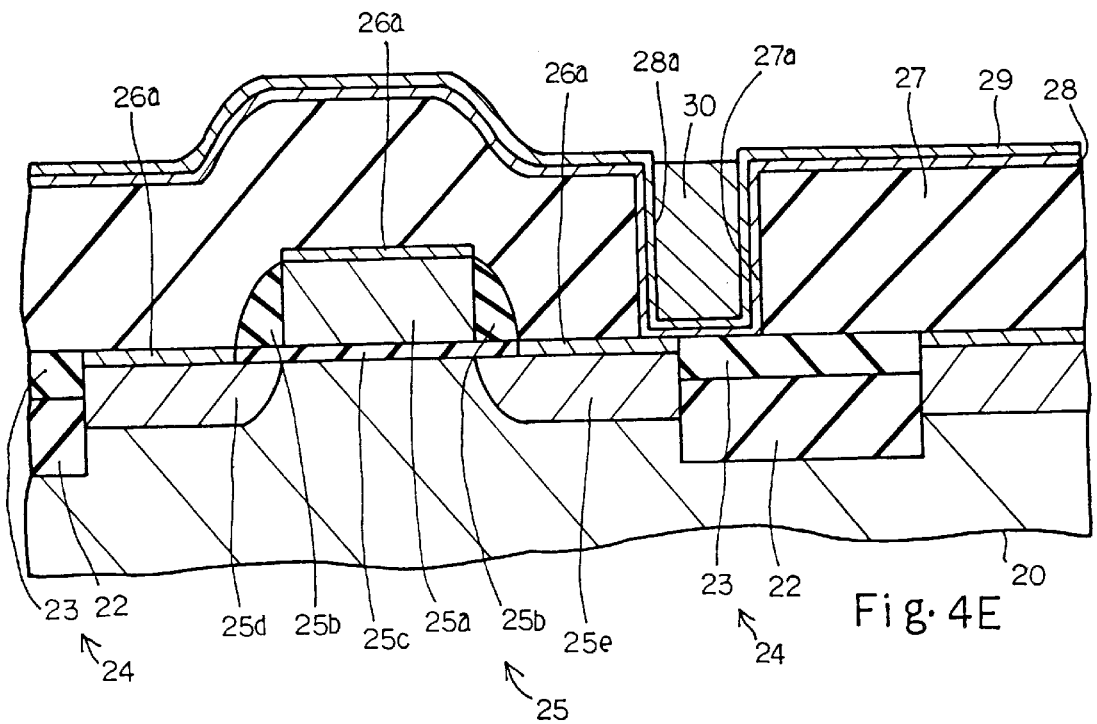

Tungsten is deposited to 1.5 micron thick over the exposed entire surface of the titanium nitride layer 29 by using a chemical vapor deposition, and the tungsten swell out over from the recess 28a. The tungsten layer is uniformly etched without a mask, and forms a tungsten plug 30 in the recess 28a as shown in FIG. 4E.

Figure 4F:
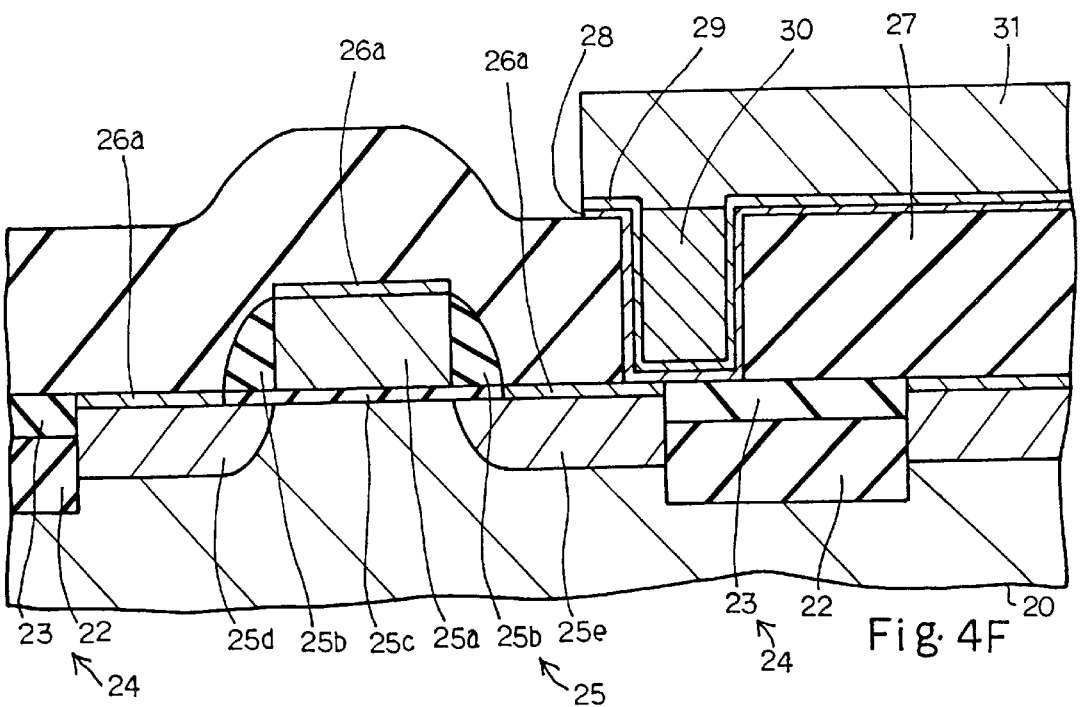

Aluminum or aluminum alloy is deposited to 500 nanometers thick over the exposed entire surface of the titanium nitride layer 29 ad the upper surface of the tungsten plug 30 by using a sputtering technique, and an appropriate photo-resist mask is provided on the aluminum/aluminum alloy layer. Using the photo-resist mask, the aluminum/aluminum alloy layer, the titanium nitride layer 29 and the titanium silicide layer 28 are successively etched away, and an aluminum strip 31 is patterned from the aluminum/aluminum alloy layer. The aluminum strip 31, the titanium nitride strip and the titanium silicide strip form in combination a metal wiring 31 on the inter-level insulating layer 27 as shown in FIG. 4F.

The aluminum strip 31 is electrically connected through the tungsten plug 30 and the titanium nitride/titanium silicide strips to the titanium silicide region 26a on the n-type source/drain region 25e.

In this instance, the tungsten plug 30, the titanium nitride strip and the titanium silicide strip as a whole constitute a contact structure.

Figure 5:
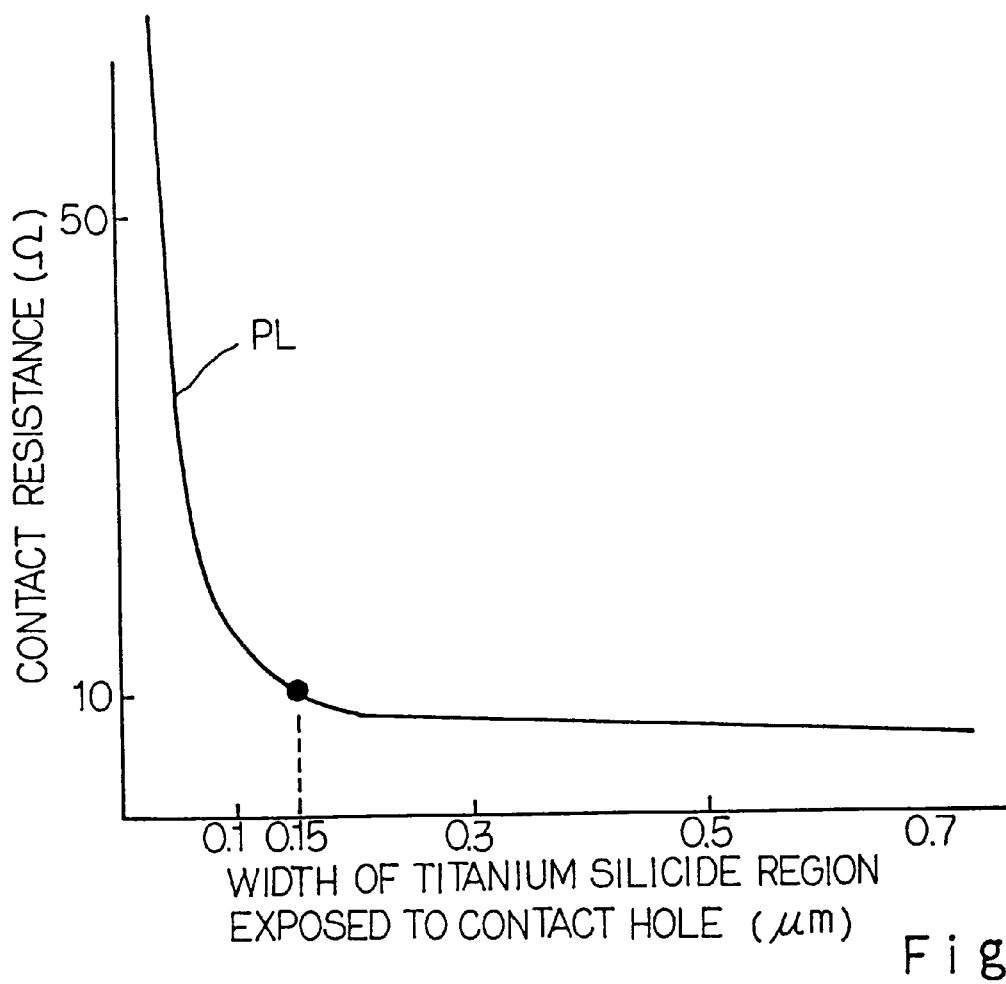
FIG. 5 is a graph showing a contact resistance in terms of an overlapped length between an impurity region and a contact hole.

The present inventor measured the contact resistance across the titanium silicide region 26a. The contact hole 27a was 0.5 micron in diameter, and the present inventor varied the width of the titanium silicide region 26a exposed to the contact hole 27a. The variation of the contact resistance was represented by plots PL in FIG. 5. As will be understood, the contact resistance was constant in so far as the width was not less than 0.15 micron.

When the contact hole 27a is formed in the inter-level insulating layer 27, the photo-resist mask may be deviated from the appropriate position. However, if the titanium silicide layer 26a is exposed to the contact hole 27a at least 0.15 micron, the contact resistance does not deteriorates the signal propagation characteristics. I other words, the width of the n-type source/drain region 25e is minimized by virtue of the contact structure according to the present invention. In fact, when the contact hole 27a is 0.5 micron in diameter, the n-type source/drain region 25e is decreased to 0.5 micron in width without a short-circuit.

The narrow n-type source/drain region decreases a parasitic capacitance, and the signal propagation is further accelerated.

Although particular embodiments of the present invention have been shown and described, it will be obvious to those skilled in the art that various changes and modifications may be made without departing from the spirit and scope of the present invention.

For example, a p-channel type MIS transistor may be fabricated on an n-type well or an n-type silicon substrate through the process according to the present invention.

Moreover, a bipolar transistor or another circuit component such as, for example, a resistor or a capacitor may be fabricated on the active area instead of or together with the MIS type field effect transistor 25.

What is claimed is:

1. A process for fabricating a semiconductor device, comprising the steps of:

selectively forming a groove in a semiconductor substrate so as to define an active area in said semiconductor substrate;

forming a first insulating layer in said groove so as to partially fill said groove;

forming a second insulating layer on said first insulating layer so that said first insulating layer and said second insulating layer form in combination a buried isolating region filling in said groove;

selectively introducing a dopant impurity into said active area so as to form an impurity region having a portion held in contact with a side surface of said buried isolating region;

forming an inter-level insulating layer of an insulating material different from that of said second insulating layer so that said buried isolating region and said impurity regions are covered with said inter-level insulating layer;

selectively removing said inter-level insulating layer so as to form a contact hole to which said portion of said impurity region and a part of said buried isolating region are exposed, said second insulating layer serving as an etching stopper during the selective removal of said inter-level insulating layer and forming a contact structure in said contact hole and in contact with said buried isolating region by depositing a first refractory metal layer on the inner surface of said contact hole, depositing a second refractory metal layer on the first refractory metal layer, depositing a conductive metal layer on the second refractory metal layer, and uniformly etching the conductive metal layer so as to leave behind a plug of said conductive metal in said contact hole.

2. The process as set forth in claim 1, and including the step of activating said dopant impurity using heat.

3. The process as set forth in claim 1, wherein said conductive metal layer comprises tungsten.

4. A process for fabricating a semiconductor device, comprising the steps of:

forming a buried isolating region in a semiconductor substrate so as to define an active area;

selectively introducing a dopant impurity into said active area so as to form an impurity region having a portion held in contact with a side surface of said buried isolating region;

forming an inter-level insulating layer so that said impurity region and said buried isolating region are covered therewith;

forming a contact hole in said inter-level insulating layer in such a manner that said portion of said impurity region and a part of said buried isolating region are exposed thereto;

depositing a refractory metal silicide layer at least on the inner surface of said contact hole so as to form a refractory metal silicide layer in contact with both said portion of said impurity region and said part of said buried isolating region;

depositing a refractory metal nitride layer on said refractory metal silicide layer;

depositing a conductive metal layer on said refractory metal silicide layer; and uniformly etching said conductive metal layer, without a mask, whereby to form a conductive metal plug in said contact hole.

5. The process as set forth in claim 4, further comprising the step of forming a metal wiring strip in contact with the upper surface of the conductive metal plug.

6. The process as set forth in claim 5, wherein said metal wiring comprises aluminum.

7. The process as set forth in claim 5, wherein said metal wiring comprises an aluminum alloy.

8. The process as set forth in claim 4, wherein said dopant impurity is activated using heat.

9. The process as set forth in claim 4, wherein said conductive metal layer comprises tungsten.

* * * * *